US008013361B2

(12) United States Patent
Yamashita et al.

(10) Patent No.: US 8,013,361 B2
(45) Date of Patent: Sep. 6, 2011

(54) SEMICONDUCTOR DEVICE AND METHOD FOR FABRICATING THE SAME

(75) Inventors: Kyoji Yamashita, Kyoto (JP); Katsuhiro Otani, Nara (JP); Katsuya Arai, Kyoto (JP); Daisaku Ikoma, Osaka (JP)

(73) Assignee: Panasonic Corporation, Osaka (JP)

( * ) Notice: Subject to any disclaimer, the term of this patent is extended or adjusted under 35 U.S.C. 154(b) by 577 days.

(21) Appl. No.: 11/270,602

(22) Filed: Nov. 10, 2005

(65) Prior Publication Data

US 2006/0097294 A1    May 11, 2006

(30) Foreign Application Priority Data

Nov. 10, 2004   (JP) ................................. 2004-326840

(51) Int. Cl.
*H01L 27/118* (2006.01)
(52) U.S. Cl. ........ 257/202; 257/204; 257/207; 257/208; 257/288; 257/E27.108; 438/128
(58) Field of Classification Search .................. 257/204, 257/E27.108, 202, 207, 208, 288; 438/128
See application file for complete search history.

(56) References Cited

U.S. PATENT DOCUMENTS 5,275,962 A * 1/1994 Hashimoto .................... 438/130
5,489,544 A * 2/1996 Rajeevakumar .............. 438/244
6,008,081 A * 12/1999 Wu ................................ 438/210
6,225,155 B1 * 5/2001 Lin et al. ....................... 438/238
6,372,565 B2 * 4/2002 Kim .............................. 438/200

FOREIGN PATENT DOCUMENTS

| JP | 61-256651 | 11/1986 |
| JP | 11-274099 | 8/1999 |
| JP | 2004-030382 | 1/2004 |

OTHER PUBLICATIONS

Japanese Notice of Reasons for Rejection, with English Translation, issued in Japanese Patent Application No. JP 2004-326840, dated Apr. 28, 2009.

* cited by examiner

*Primary Examiner* — Matthew E Warren
*Assistant Examiner* — John Lin
(74) *Attorney, Agent, or Firm* — McDermott Will & Emery LLP

(57) ABSTRACT

Gate electrodes 5A through 5F are formed to have the same geometry, and protruding parts of the gate electrodes 5A through 5F extend across an isolation region onto impurity diffusion regions. The gate electrode 5B and P-type impurity diffusion regions 7B6 are connected through a shared contact 9A1 to a first-level interconnect M1H, and the gate electrode 5E and N-type impurity diffusion regions 7A6 are connected through a shared contact 9A2 to a first-level interconnect M1I. In this way, contact pad parts of the gate electrodes 5A through 5F can be located apart from active regions of a substrate for MOS transistors. This suppresses the influence of the increased gate length due to hammerhead and gate flaring. As a result, transistors TrA through TrF can have substantially the same finished gate length.

12 Claims, 13 Drawing Sheets

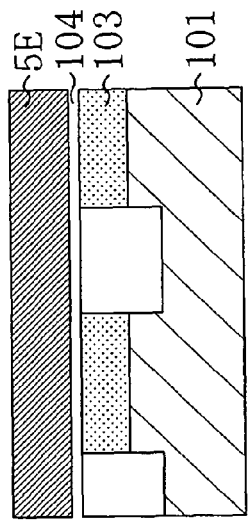
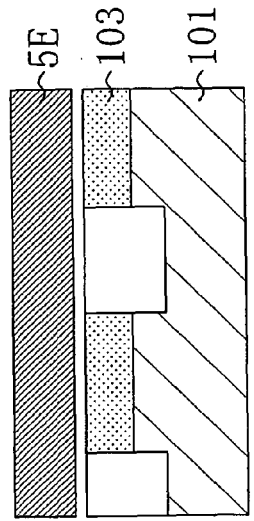
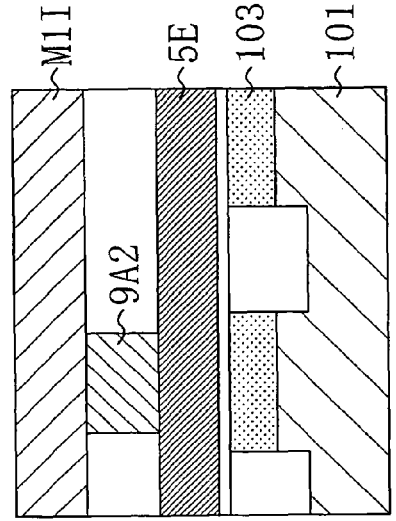
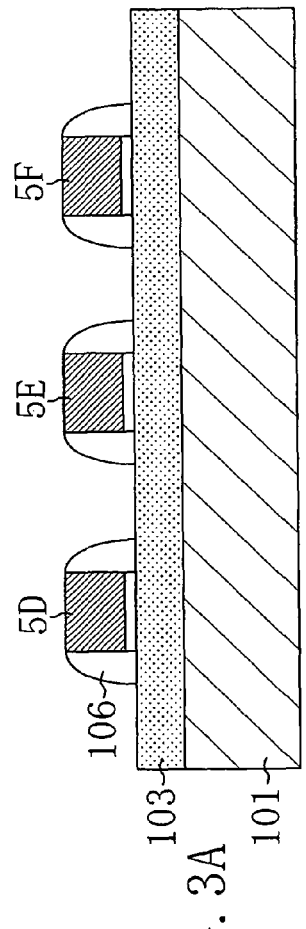
FIG. 3A
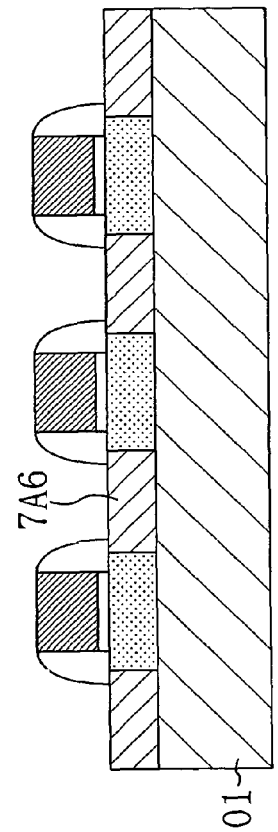
FIG. 3B
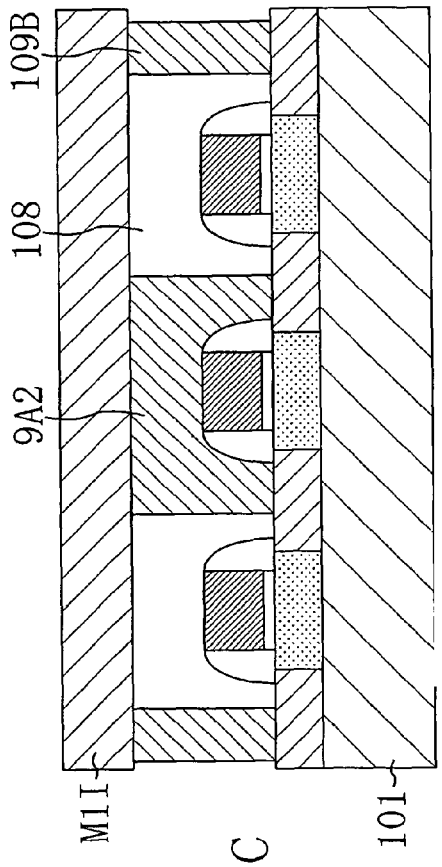
FIG. 3C

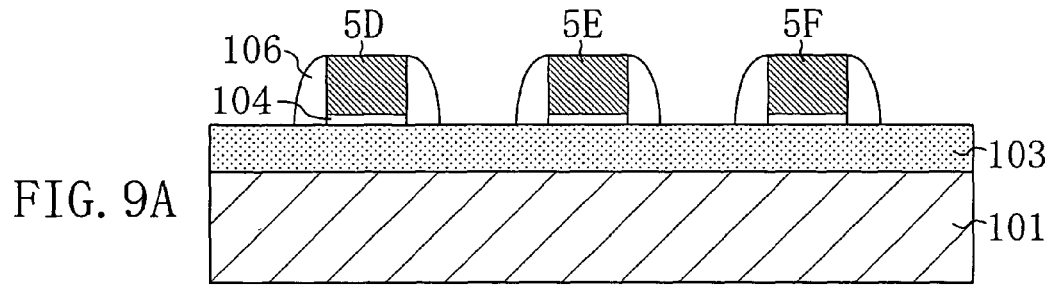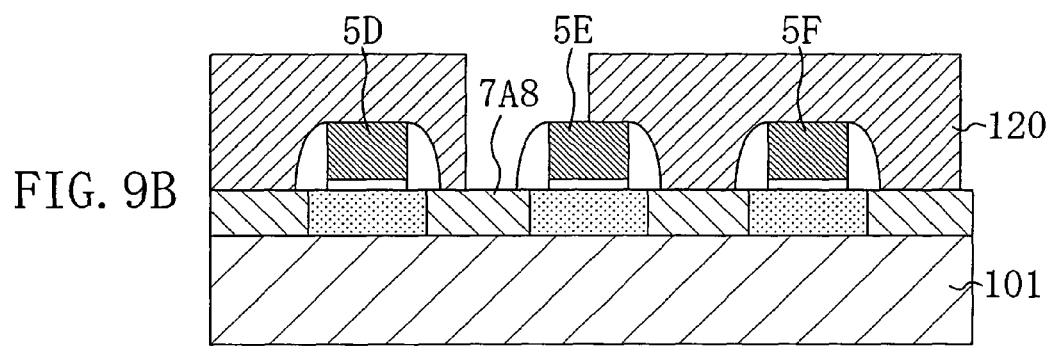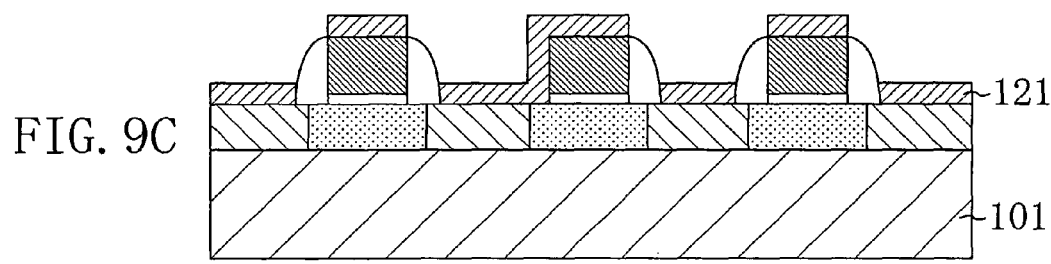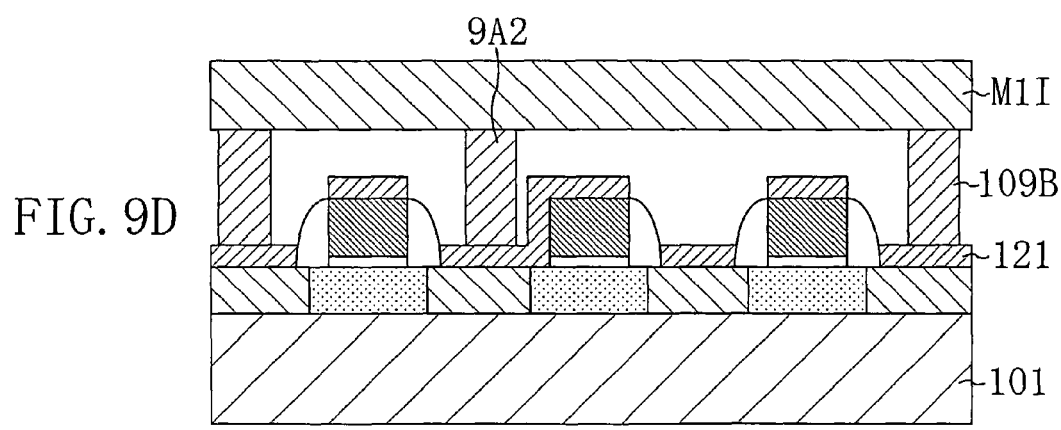

Before OPC

After OPC

SEMICONDUCTOR DEVICE AND METHOD FOR FABRICATING THE SAME

CROSS-REFERENCE TO RELATED APPLICATIONS

This application claims priority under 35 U.S.C. §119 on Patent Application No. 2004-326840 filed in Japan on Nov. 10, 2004, the entire contents of which are hereby incorporated by reference.

BACKGROUND OF THE INVENTION (1) Field of the Invention

The present invention relates to a semiconductor device comprising a refined transistor, and more particularly relates to countermeasures against an optical proximity effect in a fabrication process for semiconductor devices.

(2) Description of Related Art

Principal factors for causing variation in propagation delay time in design of a semiconductor integrated circuit (LSI) are an operation power voltage, a temperature, process variation and the like. Also, in LSI design, the operation of an LSI should be guaranteed even when all the conditions are the worst. A gate length of a transistor is a significant element for defining the operation of the transistor, and influence of variations in the gate length occupies a very large proportion in the process variation. Furthermore, in accordance with development in refinement of transistors, the gate length is reduced and hence their variation is increased. Therefore, since variation in the propagation delay time is increased and hence a design margin is increased, it has become difficult to provide LSIs with high performance.

In general, in the semiconductor fabrication process, photolithography process including resist application, exposure and development, etching process for patterning an element by using a resist mask and resist removing process are repeatedly carried out, so as to form an integrated circuit on a semiconductor substrate. Also in forming a gate of a transistor, the photolithography process, the etching process and the resist removing process are performed. In the exposure of the photolithography process, when the dimension of a pattern is smaller than the wavelength of exposing light, the error between a layout dimension set in the design and an actual pattern dimension formed on a semiconductor substrate is increased due to an optical proximity effect caused by influence of diffracted light.

Examples of the technique for overcoming this problem are super-resolution technique using a phase shift mask and OPC (optical proximity correction) technique for correcting the influence of the optical proximity effect by correcting a circuit pattern drawn on a mask.

FIG. 10 is a plan view showing a part of a semiconductor integrated circuit. FIGS. 11A and 11B are graphs for explaining an example of an OPC technique. FIG. 10 shows the layout of an N-channel type transistor typically used in a standard cell.

FIG. 10 shows a gate electrode 52, dummy gate electrodes 51 and 53 between which the gate electrode 52 is formed, and N-type impurity diffusion regions 7A1 located to both sides of the gate electrode 52. Lg denotes a gate length, Wg denotes a gate width, DWG denotes an adjacent gate length (the length of each dummy gate electrode), and S denotes a gate space (the distance between the gate electrode and each dummy gate electrode). Although an LSI has various dimensions, such as different gate lengths Lg, gate spaces S and adjacent gate lengths DGW, the differences between mask dimensions and dimensions on a finished product are corrected by the OPC technique. FIGS. 11A and 11B show how the finished gate length Lg varies according to variations in the adjacent gate length DGW when each gate space S is fixed. As shown in FIGS. 11A and 11B, before the OPC, with the variation in the adjacent gate lengths DGW from 0.1 μm to 0.5 μm, the finished gate length Lg changes from 0.11 μm to 0.16 μm when an original gate length on a mask is 0.10 μm. On the other hand, after the OPC, the finished gate length Lg changes only from 0.102 μm to 0.11 μm. This shows that the OPC technique can significantly improve the dependence of the finished gate length Lg on a pattern due to the influence of the optical proximity effect.

Furthermore, a method in which connection information between circuit elements including finished dimensions are fed back to a net list while an integrated circuit is subjected to OPC is also effective. This method is typified by Japanese Unexamined Patent Publication No. 2004-30382.

FIG. 12 is a flow chart showing a typical known fabrication method for a semiconductor integrated circuit using OPC. It is an object of the known art shown in FIG. 12 to determine the error between element values due to a rounded reflex angle resulting from exposure in the fabrication of a semiconductor device. A detector 51 detects an element pattern having a reflex angle from physical data indicating element patterns formed on a semiconductor substrate. An error calculator 52 calculates an error caused by rounding a part of the element pattern having a reflex angle during exposure. An element value calculator 53 calculates the variation in the value of the corresponding element based on the error calculated by the error calculator 52.

SUMMARY OF THE INVENTION

As previously mentioned, in accordance with development in refinement of transistors, the gate length becomes shorter and the optical proximity effect caused by diffracted light more significantly affects the gate in exposing the gate to light. The OPC technique significantly improves the dependence of the finished gate length Lg on a pattern due to the influence of the optical proximity effect but it is impossible to completely correct the above dependence. Therefore, it is difficult to accurately correct all the patterns used in a standard cell.

Furthermore, it is very difficult to accurately predict all the patterns used in a standard cell even by the method in which, as disclosed in Japanese Unexamined Patent Publication No. 2004-30382, connection information between circuit elements including finished dimensions are fed back to a net list.

The problems will be described hereinafter in more details.

The optical proximity effect in the formation of the gate occurs depending on the layout pattern of the gate of a transistor, and causes not only variations in the gate length among transistors but variations in the gate length along the gate width. In generations with design rules of 0.13 μm, 90 nm and 65 nm, two significant factors behind gate length variations are as follows:

(1) Assume that a continuous gate electrode includes a transistor part existing on an active region of a semiconductor substrate, a gate interconnect part extending from the transistor part onto an isolation region of the semiconductor substrate, and a pad part for forming a contact through which a gate interconnect is connected to an upper interconnect. In this case, a reflex angle formed at the boundary between the pad part and the gate interconnect part is rounded due to the optical proximity effect. This makes a dimension of the gate electrode part located on the active region, i.e., the gate length of a transistor, larger than a desired gate length. This phenomenon is hereinafter referred to as "the increased gate length due to gate flaring".

(2) Assume that a continuous gate electrode includes a transistor part existing on an active region of a semiconductor substrate and a gate protruding part extending from the transistor part onto an isolation region of the semiconductor substrate. In this case, the gate electrode is subjected to OPC for preventing the length of the gate protruding part from being reduced. More particularly, in order to prevent reduction in the length of the gate protruding part, the dimensions of a part of the gate located on the isolation region are increased. This makes the dimension of the gate electrode part located on the active region, i.e., the gate length of a transistor, larger than a desired gate length. This phenomenon is hereinafter referred to as "the increased gate length due to hammerhead".

FIGS. 13 and 14 are a plan view showing the design geometry of an N-channel type transistor typically used in a standard cell and a plan view showing the geometry of a fabricated N-channel type transistor, respectively.

FIG. 13 shows an N-channel type transistor comprising a gate electrode 52 having a reflex angle. 7A1, Lg and Wg denote N-type impurity diffusion regions of a substrate, a gate length and a gate width, respectively.

As shown in FIG. 13, a gate electrode 52 is formed to extend across the boundary between N-type impurity diffusion regions 7A1 and an isolation region of the substrate. A part of the gate electrode 52 located immediately above the N-type impurity diffusion regions 7A1 serves as a transistor part 52C, a part thereof located immediately above the isolation region serves as a gate interconnect part 52B, and a rectangular enlarged part thereof having a large area near the middle of the gate interconnect part 52B serves as a contact pad part 52A. The contact pad part 52A includes a contact 9B1 through which the gate interconnect part 52B is connected to an upper interconnect. Furthermore, a part of the gate electrode 52 extending from the transistor part 52C onto the isolation region serves as a gate protruding part 52D. The N-type impurity diffusion regions 7A1 forms a part of an N-type transistor including a gate of a gate width Wg and a gate length Lg. Source/drain contacts 9B2 and 9B3 are connected to the N-type impurity diffusion regions 7A1.

FIG. 14 shows the geometry of a gate electrode which has been actually formed on a semiconductor substrate by subjecting the gate electrode having the design geometry shown in FIG. 13 to a semiconductor device fabricating process including a photolithographic step, an etching step and a resist removing step. As shown in FIG. 14, the boundary between the gate interconnect part 52B and the contact pad part 52A has a reflex angle rounded under the influence of the optical proximity effect when exposed to light. Accordingly, as shown in FIG. 14, a part of the gate electrode located on the end parts of the N-type impurity diffusion regions 7A1 located near the contact pad part 52A has an increased gate length of Lg1, resulting in an error of Lg1−Lg with respect to the desired gate length Lg on the design geometry. Furthermore, a part of the gate electrode located on the end parts of the N-type impurity diffusion regions 7A1 located near the gate protruding part 52D has an increased gate length of Lg3 due to hammerhead arising from the gate protruding part 52D, resulting in an error of Lg3−Lg with respect to the desired gate length Lg on the design geometry. The maximum deviation from the desired finished gate length along the gate width is referred to as δLg which is defined as follows:

$$\delta Lg = MAX[MAX(Lg1, Lg2, Lg3) - Lg, Lg - MIN(Lg1, Lg2, Lg3)]$$

δLg varies according to the distance between the transistor part 52C and the contact pad part 52A. Accordingly, in the known art, the variations in the finished gate length according to the geometry of the gate electrode 52 increase variations in the propagation delay time, resulting in the increased design margin. This makes it difficult to provide LSIs with high performance.

To cope with this, it is considered to suppress variations in the gate electrode by making the geometries of impurity diffusion regions or those of adjacent gate electrodes equal to one another. FIG. 15A is a plan view showing an example of the design geometry of a CMOS transistor. FIGS. 15B and 16 are plan views showing an example of the design geometry of a fabricated CMOS transistor. In FIGS. 15A and 15B, 5A, 5B, 5C, 5D, 5E, and 5F denote gate electrodes, 7A5 and 7A6 denote N-type impurity diffusion regions, and 7B5 and 7B6 denote P-type impurity diffusion regions.

It should be considered that as illustrated in FIGS. 15A, 15B and 16, masks for gate electrodes each including a transistor part, a gate interconnect part, a contact pad part, and a gate protruding part are formed to have the same geometry and hence N-channel type transistors and P-channel type transistors can be finished to have the same geometry. CA1, CA2, CA3, CA4, CA5, CA6, CA7, CA8, CA9, and CA10 denote gate contacts through which the gate electrodes or impurity diffusion regions are connected to first-level interconnects, M1A, M1B, M1C, M1D, M1E, M1F, and M1G denote first-level interconnects, V1A, V1B and V1C denote vias through which the first-level interconnects are connected to a second-level interconnect, and 112 denotes the second-level interconnect. An N-channel type transistor TrA and a P-channel type transistor TrD form an inverter INV1, and an N-channel type transistor TrC and a P-channel type transistor TrF form an inverter INV2. In order to isolate these inverters INV1 and INV2 from each other, an N-channel type transistor TrB and a P-channel type transistor TrE are used as off transistors by connecting the gates of the transistors TrB and TrE to a power source VSS (potential=0) and a power source VDD (potential=1.2V), respectively.

However, even when the above countermeasure is taken, there still remain the following two problems.

First, since the gate electrodes are isolated from one another by an N-channel type transistor and a P-channel type transistor, transistor parts of the gate electrodes are located relatively close to contact pad parts and gate protruding parts thereof to secure gate widths to some extent. This still causes the problem that the finished gate length along the gate width is not constant because of the above-mentioned increased gate length due to gate flaring and hammerhead. This deteriorates the Ion-Ioff characteristics and increases the variation in the transistor characteristics caused by the out-of-alignment between OD-GA masks.

Next, since the gates of the off transistors are connected through the first-level interconnect to the power sources, the drains of the N-channel type transistors and P-channel type transistors serving as outputs of the inverters need to be connected through the second-level interconnect to each other. This reduces the area of the second-level interconnect for connecting cells to one another.

When as shown in FIG. 16, the cell height is increased, transistor parts of gate electrodes are located sufficiently apart from contact pad parts thereof and the lengths of gate protruding parts thereof are sufficiently increased, the problem that the finished gate length along the gate width is not constant is solved. However, this causes a new problem that the area of each cell is increased and thus the area of an LSI is increased.

It is an object of the present invention to restrain the gate length from varying due to the optical proximity effect and provide a semiconductor device configuration for achieving a high-performance LSI having a small area through refinement process.

In order to solve the above problems, a semiconductor device according to a first aspect of the present invention includes: a well formed on a substrate and containing an impurity of a first conductivity type; first impurity diffusion regions formed on the well and containing an impurity of a second conductivity type; an isolation insulating film surrounding the first impurity diffusion regions; a plurality of gate electrodes of the same geometry extending across the first impurity diffusion regions onto the isolation insulating film; a power voltage supply line; second impurity diffusion regions of the first conductivity type formed in regions of the well located to both sides of at least one of the plurality of gate electrodes, said second impurity diffusion regions being electrically connected to said power voltage supply line; and a first contact through which the at least one gate electrode is connected to the power voltage supply line.

With this structure, first, since the plurality of gate electrodes have the same geometry, the finished gate electrodes can be made uniform. Furthermore, since the at least one gate electrode extends to the second impurity diffusion regions electrically connected to the power voltage supply line, the first impurity diffusion region serving as source/drain regions of a transistor can be located apart from contact pad parts of the gate electrodes. This can suppress the influence of the increased gate length due to hammerhead and gate flaring in the formation of the gate electrodes. Therefore, a plurality of gate electrodes can be finished such that their transistor parts have substantially the same gate length.

Furthermore, when a circuit, such as a CMOS circuit, is configured to have the structure of the present invention, a supply voltage (VDD or VSS) for electrically isolating gate electrodes from one another is supplied from the power voltage supply line. In the semiconductor device of the present invention, an interconnect through which various parts of transistors forming a CMOS circuit are connected to one another can be formed in the same interconnect layer as the power voltage supply line. This can make the flexibility of the interconnect routing larger than that in the known art.

The first contact is preferably a shared contact through which the at least one gate electrode and the second impurity diffusion regions are connected to the power voltage supply line. This permits the simultaneous supply of the supply voltage through the shared contact to both the substrate and the gate electrode.

Each of the plurality of gate electrodes except for the at least one gate electrode may have sidewalls of an insulator on both sides thereof, and the at least one gate electrode may have no sidewall of an insulator on only one side or either side thereof. Therefore, the shared contact can be brought into contact also with one side surface of the gate electrode. This reduces the area of an opening for the shared contact. In the semiconductor device of the present invention, a contact hole becomes likely to be formed as designed.

The semiconductor device according to the first aspect of the present invention may further include salicide films formed on the plurality of gate electrodes and the second impurity diffusion regions, wherein the at least one gate electrode and at least one of the second impurity diffusion regions may be connected through one of the salicide films to the shared contact. With this structure, a salicide film can be formed to cover a side surface of the gate electrode on which no sidewall is formed and the top surface of the gate electrode and the second impurity diffusion region. Therefore, when the shared contact makes contact with a part of this salicide film, a supply voltage can be supplied to the substrate and the gate electrode. Therefore, the area of the opening for the shared contact can be brought closer to the area of an opening for each of the other contacts.

The second impurity diffusion regions may be formed in regions of the well located to both sides of the plurality of gate electrodes.

In this case, the semiconductor device may further include second contacts through which some of the second impurity diffusion regions located to at least one sides of the plurality of gate electrodes except for the at least one gate electrode are connected to the power voltage supply line. In this case, a supply voltage can be more certainly supplied to the substrate.

The second impurity diffusion regions may be located to both sides of a protruding part of the at least one gate electrode, and the isolation insulating film may be formed below protruding parts of the plurality of gate electrodes except for the at least one gate electrode. This can reduce the parasitic capacitances produced in the protruding parts of the gate electrodes as compared with when a semiconductor layer, such as a threshold control layer, is formed immediately below a protruding part of a gate electrode.

The semiconductor device may further include: third impurity diffusion regions of the first conductivity type formed to at least one sides of the protruding parts of the plurality of gate electrodes except for the at least one gate electrode without being connected to the second impurity diffusion regions; and third contacts through which the third impurity diffusion regions are connected to the power voltage supply line.

A semiconductor device according to a second aspect of the present invention includes: a well formed on a substrate and containing an impurity of a first conductivity type; a plurality of gate electrodes formed on the well; impurity diffusion regions formed in regions of the well located to both sides of at least one of the plurality of gate electrodes and containing an impurity of a first conductivity type; an interconnect; and a shared contact through which the at least one gate electrode and the impurity diffusion regions are connected to the interconnect, wherein each of the plurality of gate electrodes except for the at least one gate electrode may have sidewalls of an insulator on both sides thereof, and the at least one gate electrode has a sidewall of an insulator on only one side thereof or no sidewall on either side thereof. Therefore, the gate electrode and the impurity diffusion regions located to both sides of the gate electrode can be connected through one shared contact to an interconnect. In addition, the shared contact can be brought into contact with one side surface of the gate electrode. This can further reduce the area of the opening for the shared contact.

A method for fabricating a semiconductor device of the present invention includes the steps of: (a) forming a plurality of gate electrodes above a well of a first conductivity type formed on a substrate; (b) forming impurity diffusion regions in regions of the well located to both sides of at least one of the plurality of gate electrodes by implanting an impurity of the first conductivity type thereinto, said impurity diffusion regions being grounded through the substrate; (c) after the step (b), depositing an insulating film above the substrate; (d) etching the insulating film to form a hole which exposes the at least one gate electrode and the impurity diffusion regions from above; and (e) forming a shared contact that makes contact with the at least one gate electrode and the impurity diffusion regions by filling the hole formed in the step (d) with a conductive material.

With this method, the gate electrodes can extend to the impurity diffusion regions grounded through the substrate. Therefore, the first impurity diffusion region serving as source/drain regions of a MOS transistor can be located apart from contact pad parts of the gate electrodes. This can suppress the influence of the increased gate length due to hammerhead and gate flaring in the formation of the gate electrodes in the step (a).

The method may further include the steps of: (e) after the step (a) and before the step (b), forming sidewalls of an insulator on both sides of the plurality of gate electrodes; and (f) after the step (b) and before the step (c), removing the sidewall formed on at least one of the sides of the at least one gate electrode. Therefore, the side surface of the gate electrode from which the sidewall is removed can be used to make contact with the shared contact. This can further reduce the area of the opening for the shared contact.

The method may further include the step of (g) after the step (f), forming a metal film above the substrate and subjecting the substrate to heat treatment, thereby forming a salicide film to extend from the top and side surfaces of the at least one gate electrode to the top surface of at least one of the impurity diffusion regions.

Therefore, when the shared contact makes contact with any part of the salicide film, the supply voltage can be supplied to the gate electrode and the substrate. This permits the formation of contacts as designed.

BRIEF DESCRIPTION OF THE DRAWINGS

FIGS. 3A through 3C are cross-sectional views showing some of process steps in a fabricating method for a semiconductor device according to the first embodiment of the present invention.

FIGS. 9A through 9D are cross-sectional views showing some of process steps in a fabricating method for a semiconductor device (CMOS transistor) according to the third embodiment of the present invention.

DETAILED DESCRIPTION OF THE INVENTION

Embodiment 1

A first embodiment of the present invention will be described hereinafter with reference to the drawings.

Figure 1:
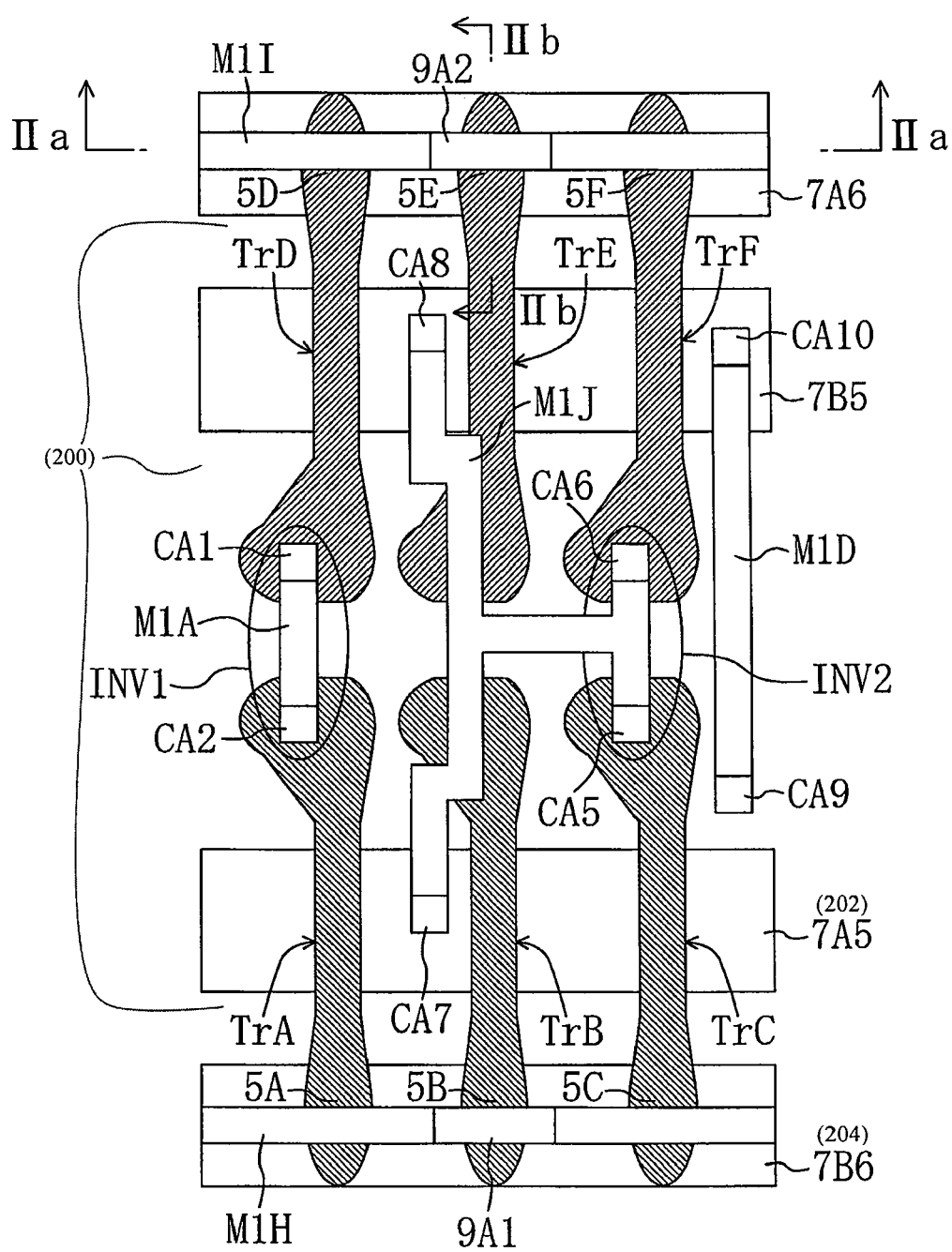
FIG. 1 is a plan view showing the geometry of a fabricated CMOS transistor according to a first embodiment of the present invention.
Figure 2A:
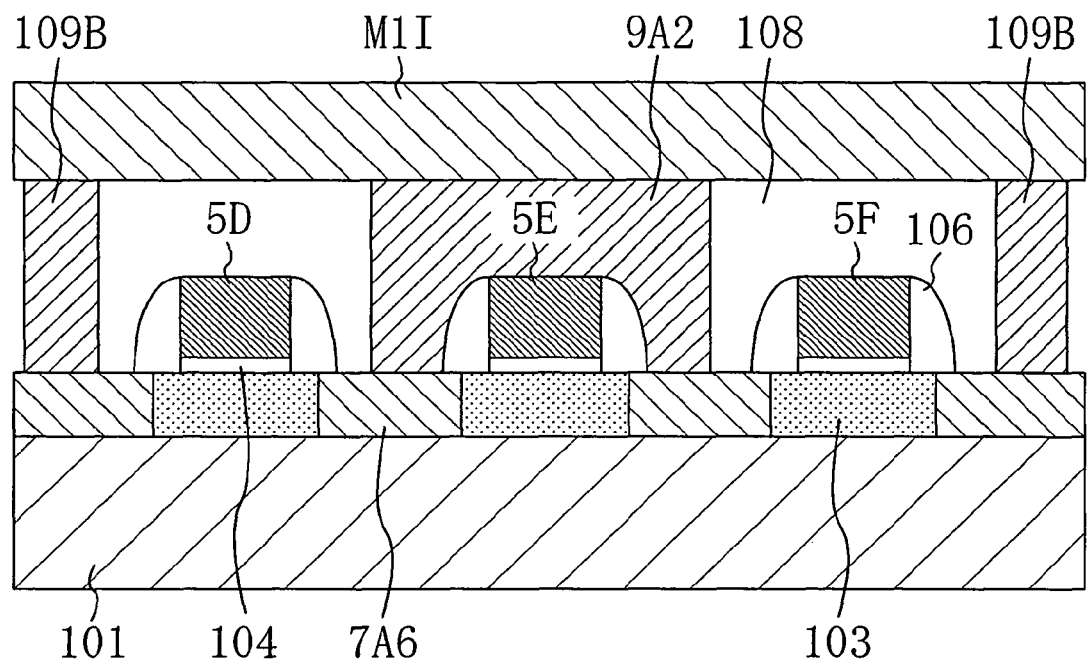
FIG. 2A is a cross-sectional view showing the CMOS transistor taken along the line IIa-IIa in FIG. 1.

FIG. 1 is a plan view illustrating the geometry of a fabricated CMOS transistor according to the first embodiment of the present invention. FIG. 2A is a cross-sectional view showing the CMOS transistor taken along the line IIa-IIa in FIG. 1, and FIG. 2B is a cross-sectional view of the CMOS transistor taken along the line IIb-IIb in FIG. 1.

In a semiconductor device (CMOS) of this embodiment shown in FIG. 1, gate electrodes 5A, 5B and 5C of the same geometry (size, length and the like) are located adjacent to one another, and gate electrodes 5D, 5E and 5F of the same geometry are located adjacent to one another. The CMOS of this embodiment includes P-type impurity diffusion regions 7B6 formed to both sides of respective protruding parts of the gate electrodes 5A and 5C and N-type impurity diffusion regions 7A5 formed to both sides of respective middle parts (transistor parts) of the gate electrodes 5A and 5C. The CMOS of this embodiment further includes N-type impurity diffusion regions 7A6 formed to both sides of respective protruding parts of the gate electrodes 5D and 5F and P-type impurity diffusion regions 7B5 formed to both sides of respective middle parts of the gate electrodes 5D and 5F. In FIG. 1, CA1, CA2, CA5, CA6, CA7, CA8, CA9, and CA10 denote contacts through which the gate electrodes or the impurity diffusion regions are connected to first-level interconnects, 9A1 and 9A2 denote shared contacts through which the combination of the gate electrode 5B and the associated impurity diffusion regions 7B6 and the combination of the gate electrode 5E and the associated impurity diffusion regions 7A6 are connected to the first-level interconnects, respectively, and M1A, M1D, M1H, M1I, and M1J denote the first-level interconnects. N-channel type MOS transistors TrA, TrB and TrC represent MOS transistors including middle parts of the gate electrodes 5A, 5B and 5C and associated pairs of the N-type impurity diffusion regions 7A5, respectively. P-channel type MOS transistors TrD, TrE and TrF represent MOS transistors including middle parts of the gate electrodes 5D, 5E and 5F and associated pairs of the P-type impurity diffusion regions 7B5, respectively.

Figure 2B:
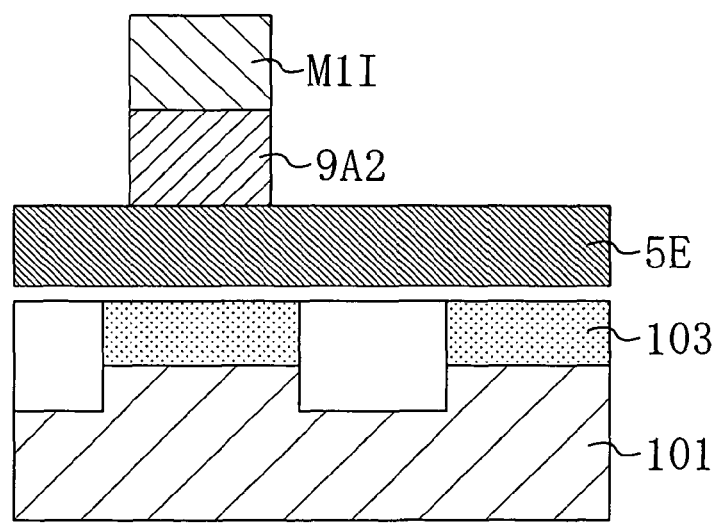
FIG. 2B is a cross-sectional view showing the CMOS transistor taken along the line IIb-IIb in FIG. 1.

As shown in FIGS. 2A and 2B, sidewalls 106 are formed on both sides of a gate electrode 5E, and N-type impurity diffusion regions 7A6 are formed in regions of an N well 101 located to both sides of gate electrodes 5D, 5E and 5F. The gate electrode 5E and two of the N-type impurity diffusion regions 7A6 located to both sides of the gate electrode 5E are electrically connected through one shared contact 9A2 to a first-level interconnect M1I for supplying a supply voltage to the gate electrode 5E and the two N-type impurity diffusion regions 7A6. This permits the turning-off of a P-channel type MOS transistor TrE under control and the application of a supply voltage to a substrate. The other N-type impurity diffusion regions 7A6 are connected through contacts 109B to the first-level interconnect Ma A shared contact 9A1 has the same structure as the shared contact 9A2. In an example shown in FIG. 2A, threshold control layers 103 are formed immediately below the gate electrodes 5D, 5E and 5F. Furthermore, as shown in FIG. 2B, the N-type impurity diffusion regions 7A5 (a second region 202) and 7A6 and the P-type impurity diffusion regions 7B5 and 7B6 (a first region 204) are surrounded by an isolation insulating film 200 (shallow trench isolation (STI)).

Figure 15B:
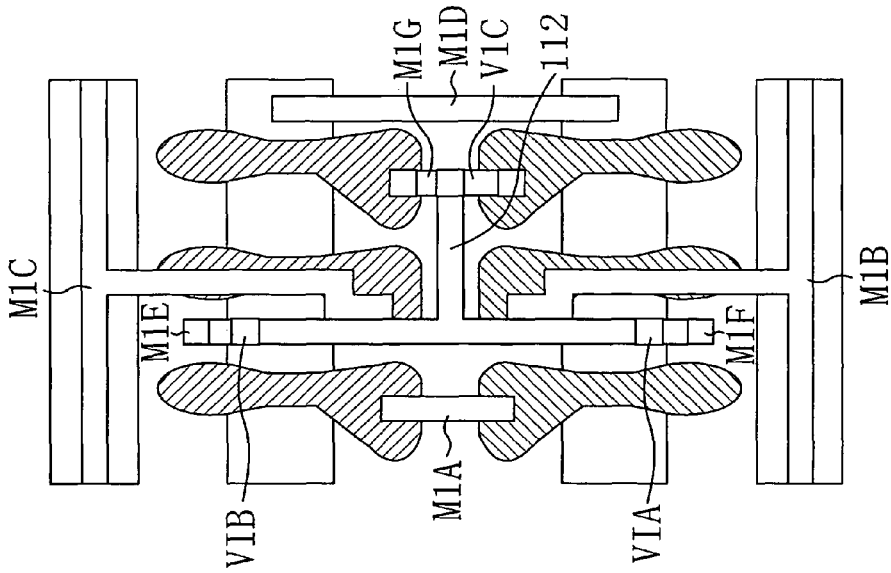
FIGS. 15A and 15B are plan views showing an example of the design geometry of a CMOS transistor.
Figure 15A:
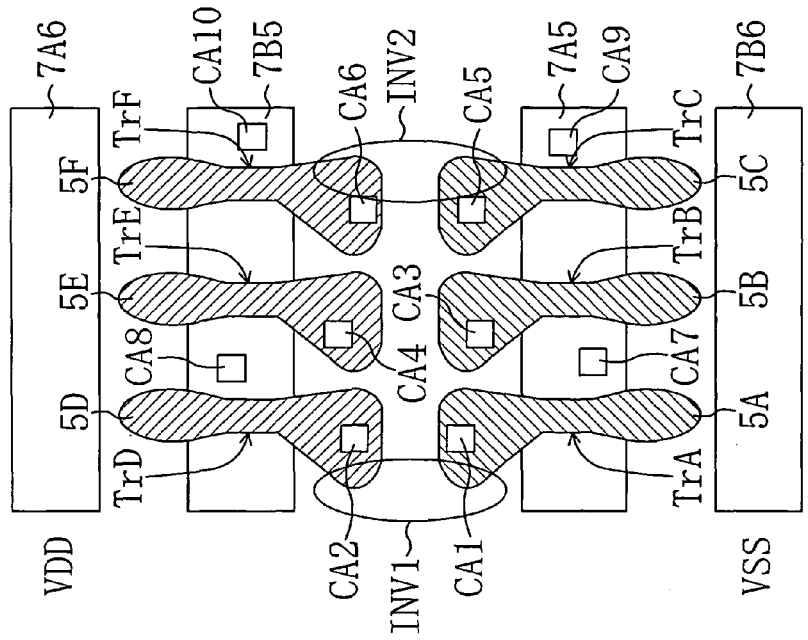
Figure 16:
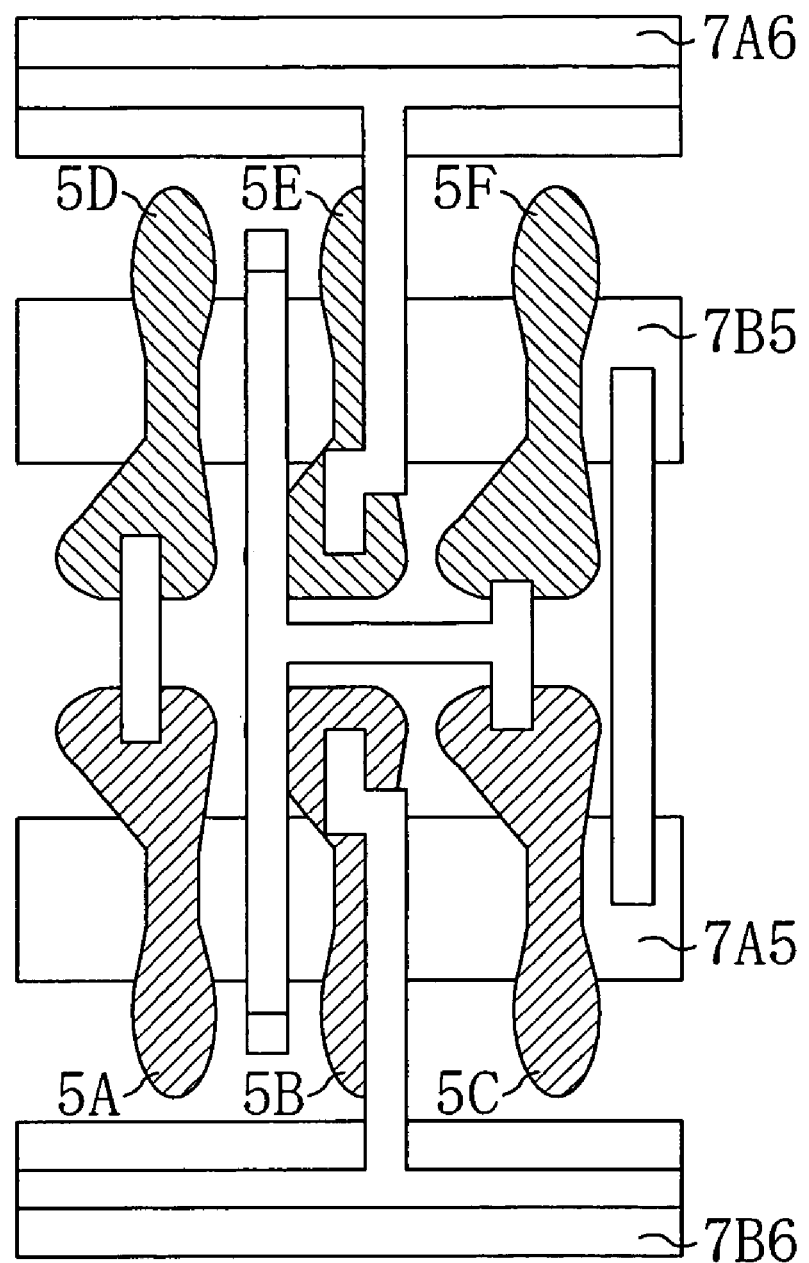
FIG. 16 is a plan view showing an example of the geometry of a fabricated CMOS transistor.

The characteristics of the CMOS of this embodiment shown in FIG. 1 will be described while being compared with the CMOS shown in FIGS. 15A and 15B.

In the CMOS of this embodiment, an inverter INV1 is composed of an N-channel type MOS transistor TrA and a P-channel type MOS transistor TrD, and an inverter INV2 is composed of an N-channel type MOS transistor TrC and a P-channel type MOS transistor TrF. An N-channel type MOS transistor TrB and a P-channel type MOS transistor TrE are turned off to electrically isolate the inverter INV1 from the inverter INV2.

In order to connect gate electrodes 5B and 5E of an N-channel type MOS transistor TrB and a P-channel type MOS transistor TrE serving as off transistors to power sources, contacts CA3 and CA4 formed on contact pad parts of the gate electrodes 5B and 5E and first-level interconnects M1B and M1C are used for the CMOS shown in FIG. 15. On the other hand, in the CMOS of this embodiment shown in FIG. 1, the N-channel type MOS transistor TrB and the P-channel type MOS transistor TrE serving as off transistors are connected to the ground and a power voltage supply unit using shared contacts 9A1 and 9A2, respectively. In this way, the gate electrode 5B is fixed at the ground potential VSS (=0 V) and the gate electrode 5E is fixed at the power supply potential VDD (for example, 1.2 V). Furthermore, the shared contacts 9A1 and 9A2 are also used to fix an N well and a P well at the power supply potential VDD and the ground potential VSS, respectively. The use of the shared contacts 9A1 and 9A2 can eliminate the need for first-level interconnects M1B and M1C which have been required in the known CMOS and through which the gate electrodes 5B and 5E of the N-channel type MOS transistor TrB and the P-channel type MOS transistor TrE are connected to the power sources. The respective drains of the N-channel type MOS transistor TrA and the P-channel type MOS transistor TrD serving as outputs of the inverter INV1 (contacts through which the impurity diffusion regions 7A5 and 7B5 are connected to the first-level interconnect M1J are represented by CA7 and CA8, respectively) can be directly connected to the gate electrodes 5C and 5F of the N-channel type MOS transistor TrC and the P-channel type MOS transistor TrF serving as inputs of the inverter INV2 (contacts through which the gate electrodes 5C and 5F are connected to the first-level interconnect M1J are represented by CA5 and CA6, respectively) by the first-level interconnect M1J. This allows the arrangement of second-level interconnects immediately above the N-channel type MOS transistor TrB and the P-channel type MOS transistor TrE serving as off transistors as desired.

In the CMOS of this embodiment, like the CMOS shown in FIG. 15, the gate electrodes 5A through 5F have the same geometry, and adjacent two of the N-channel type MOS transistors TrA through TrC share the same N-type impurity diffusion region 7A5. Furthermore, adjacent two of the P-channel type MOS transistors TrD through TrF share the same P-type impurity diffusion region 7B5. This can suppress variations in the geometries of the finished gate electrodes, resulting in the reduced design margin.

Furthermore, the CMOS of this embodiment is characterized in that protruding parts of gate electrodes 5A through 5C extend onto P-channel type impurity diffusion regions 7B6 grounded through the substrate and protruding parts of gate electrodes 5D through 5F extend onto the N-channel type impurity diffusion regions 7A6 electrically connected to the power voltage supply unit. In this way, contact pad parts of the gate electrodes of the transistors can be located apart from active regions of a substrate for the transistors. This can suppress the influence of the increased gate length due to both hammerhead and gate flaring. This makes it possible that the N-channel type MOS transistors TrA through TrC and the P-channel type MOS transistors TrD through TrF have substantially the same gate length and are finished to have a desired gate length.

FIGS. 3A through 3C are cross-sectional views showing some of process steps in a fabricating method for a semiconductor device according to this embodiment.

First, as shown in FIG. 3A, an N well 101 is formed in a substrate by selectively implanting ions thereinto. Thereafter, a trench is formed in the N well 101 and then filled with an oxide film, and a substrate region is subjected to chemical mechanical polishing (CMP), thereby forming a shallow trench isolation (STI) 102 around active regions of the substrate. Furthermore, threshold control layers 103 are formed in the N well 101 by selectively implanting ions thereinto. Next, a gate oxide film 104 is formed on (the entire substrate including) the N well 101 by rapid thermal oxidation (RTO). A polysilicon film is deposited on the gate oxide film 104, and the deposited gate oxide film 104 and polysilicon film are selectively dry-etched, thereby forming gate electrodes 5D, 5E and 5F.

Next, a SiN film is deposited on the substrate, and the deposited SiN film is dry-etched, thereby forming sidewalls 106 of SiN on both sides of the gate electrodes 5D, 5E and 5F.

Next, as shown in FIG. 3B, N-type impurity diffusion regions 7A6 are formed in regions of the N well 101 located to both sides of the gate electrodes 5D, 5E and 5F.

Next, as shown in FIG. 3C, an interlayer insulating film 108 of $SiO_2$ is deposited on the substrate, and then the deposited interlayer insulating film 108 is planarized by CMP. Parts of the interlayer insulating film 108 that will become contacts 109B and a shared contact 9A2 are selectively dry-etched to form contact holes and the contact holes are filled with tungsten (W), thereby forming contacts 109B and a shared contact 9A2 at the same time. In the same process steps as previously mentioned, N-channel type MOS transistors TrA, TrB and TrC are formed in a P well.

In the previously-mentioned manner, the semiconductor device of this embodiment can be fabricated.

In this embodiment, an example of a standard cell was described. When standard cells are actually used as an LSI, the cells preferably have the same orientation. In other words, it is unpreferable that the orientation of some of the cells is rotated by 90° with respect to the orientation of the other cells.

Furthermore, in FIG. 2A, a contact through which a gate electrode 5E is connected to a first-level interconnect M1I is formed as a shared contact 9A2. However, when the power supply potential is supplied through a contact 109B to a substrate, a normal contact through which only a gate electrode 5E is connected to a first-level interconnect M1I may be used instead of the shared contact 9A2.

Embodiment 2

Figure 4:
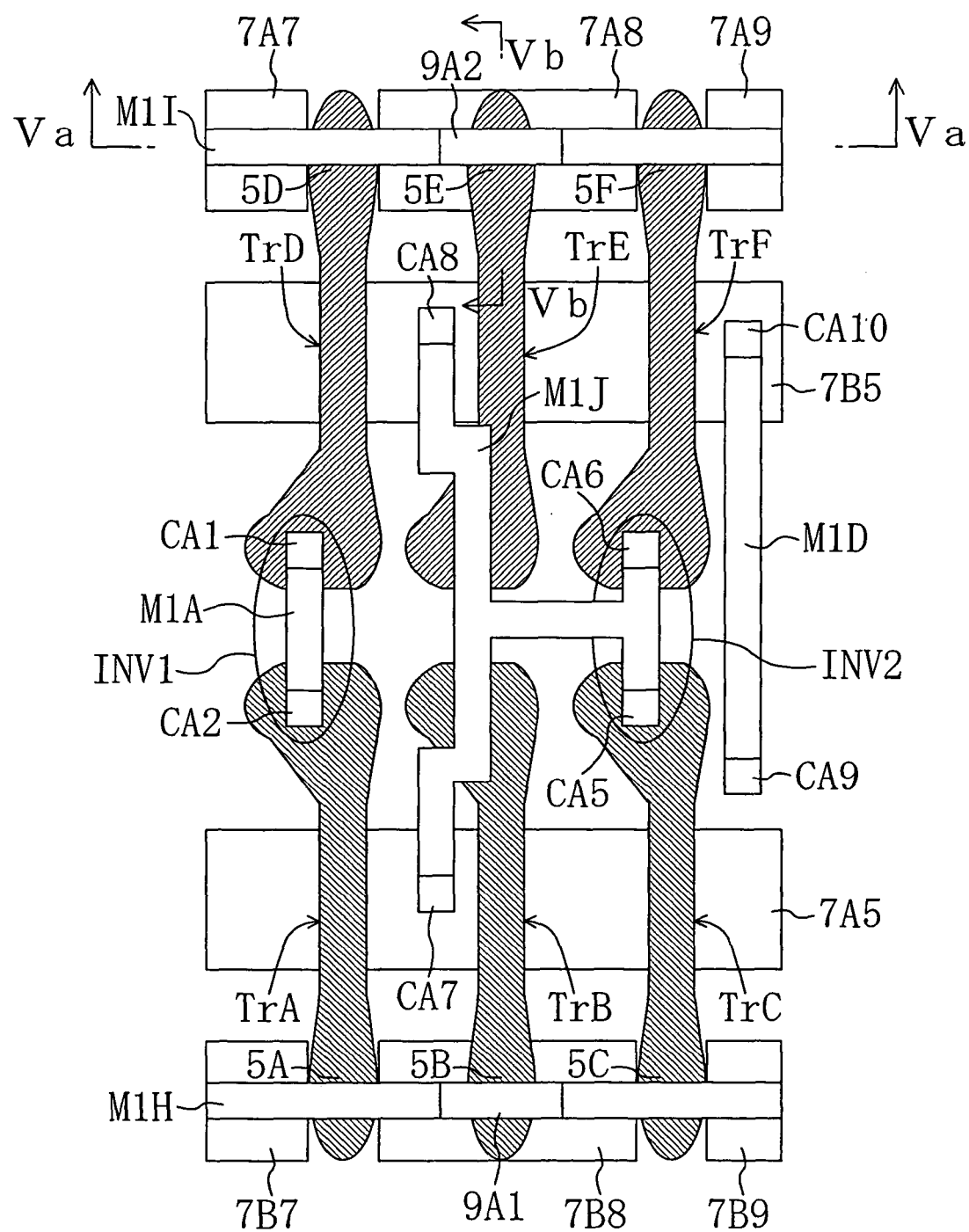
FIG. 4 is a plan view showing the geometry of a fabricated CMOS transistor according to a second embodiment of the present invention.
Figure 5A:
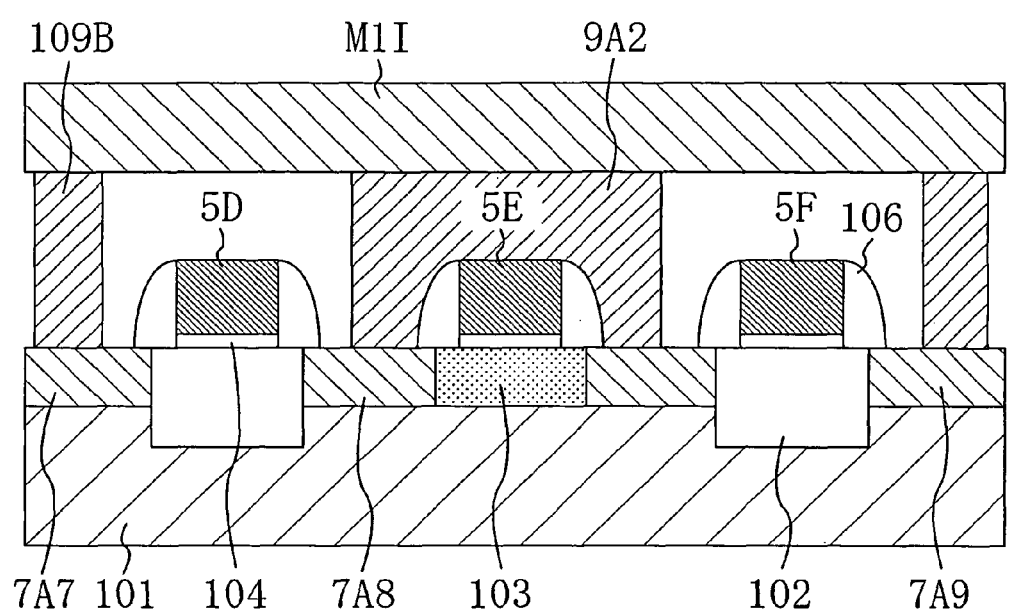
FIG. 5A is a cross-sectional view showing the CMOS transistor taken along the line Va-Va in FIG. 4.
Figure 5B:
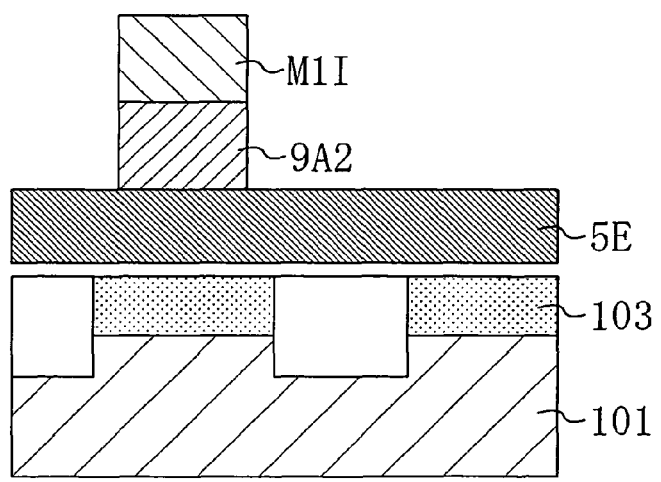
FIG. 5B is a cross-sectional view showing the CMOS transistor taken along the line Vb-Vb.

FIG. 4 is a plan view illustrating the geometry of a fabricated CMOS transistor according to a second embodiment of the present invention. FIG. 5A is a cross-sectional view of the CMOS transistor taken along the line Va-Va in FIG. 4, and FIG. 5B is a cross-sectional view of the CMOS transistor taken along the line Vb-Vb in FIG. 4. In FIGS. 4, 5A and 5B, the same reference numerals are given to the same components as in FIGS. 1, 2A and 2B, and a description thereof will be omitted.

The CMOS transistor of this embodiment is characterized in that not impurity diffusion regions but a STI 102 is formed immediately below protruding parts of gate electrodes 5A, 5C, 5D, and 5F. More particularly, as shown in FIG. 4, in the CMOS transistor of this embodiment, N-type impurity diffusion regions 7A7, 7A8 and 7A9 are formed, instead of the N-type impurity diffusion regions 7A6, in the form of islands so as to be arranged along the gate length direction. Furthermore, as shown in FIG. 5A, N-type impurity diffusion regions 7A8 are formed in regions of the N well 101 located to both sides of the protruding part of the gate electrode 5E, an N-type impurity diffusion region 7A7 is formed in a region thereof located to a side of the protruding part of the gate electrode 5D, and an N-type impurity diffusion region 7A9 is formed in a region thereof located to a side of the protruding part of the gate electrode 5F. A threshold control layer 103 containing a p-type impurity is formed in a region of the N well 101 located immediately below the protruding part of the gate electrode 5E, and a STI 102 is formed in a region of the N well 101 located immediately below the protruding parts of the gate electrodes 5D and 5F. The protruding part of the gate electrode 5E and the N-type impurity diffusion regions 7A8 located to both sides of the gate electrode 5E are connected through a shared contact 9A2 to a first-level interconnect M1I. The N-type impurity diffusion regions 7A7 and 7A9 are connected through contacts 109B to the first-level interconnect M1I.

Likewise, in the CMOS transistor of this embodiment, P-type impurity diffusion regions 7B7, 7B8 and 7B9 are formed, instead of the P-type impurity diffusion region 7B6 (see FIG. 1), in the form of islands so as to be arranged along the gate length direction. A threshold control layer containing an n-type impurity is formed in a region of a P well located immediately below a protruding part of the gate electrode 5B, and a STI 102 is formed in a region of the P well located immediately below the protruding parts of the gate electrodes 5A and 5C. The protruding part of the gate electrode 5B and the P-type impurity diffusion regions 7B8 located to both sides of the gate electrode 5B are connected through a shared contact 9A1 to a first-level interconnect M1H. The P-type impurity diffusion regions 7B7 and 7B9 are connected through contacts to the first-level interconnect M1H.

The above structure can significantly reduce the parasitic capacitances produced between protruding parts of gate electrodes and impurity diffusion regions while suppressing the influence of the increased gate length due to hammerhead and gate flaring. The reason for this is that when a STI and a gate insulating film are interposed between a substrate and a gate electrode, the parasitic capacitance produced therebetween is smaller than that produced when an impurity diffusion region is located immediately below a gate electrode. Accordingly, N-channel type MOS transistors TrA, TrB and TrC and P-channel type MOS transistors TrD, TrE and TrF can have substantially the same finished gate length and can be finished substantially as desired. Furthermore, in the CMOS transistor of this embodiment, the circuit propagation delay time can be significantly reduced.

Figure 6:
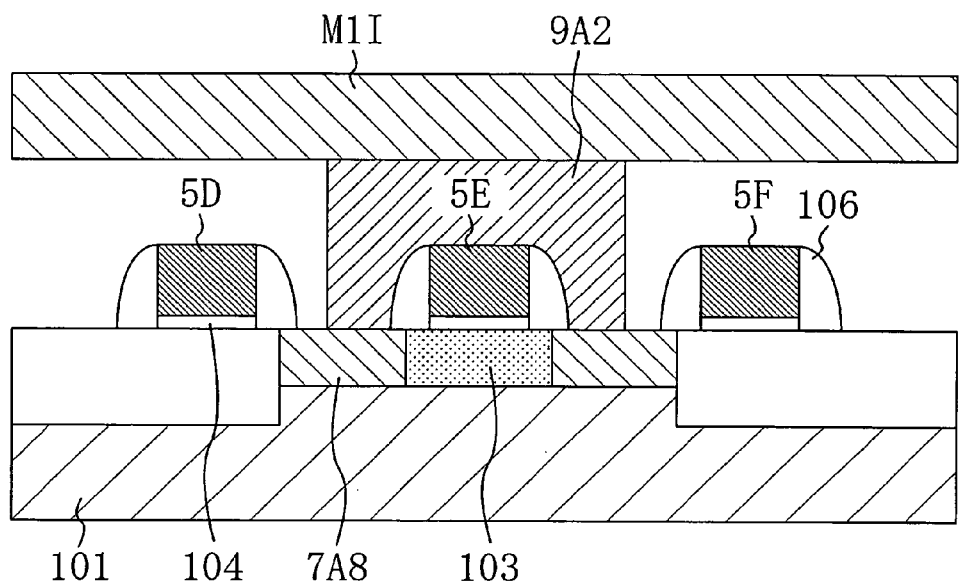
FIG. 6 is a cross-sectional view partly showing a CMOS transistor according to a variant of the second embodiment.

FIG. 6 is a cross-sectional view partly showing a CMOS transistor according to a variant of this embodiment. The above-mentioned island-like impurity diffusion regions electrically connected to a power voltage supply unit or grounded through a substrate each have a very small area, and thus in some cases, it is difficult to form a pattern for the impurity diffusion regions and make contact between a substrate and an interconnect. Therefore, as shown in FIG. 6, the CMOS transistor of this variant is configured such that a substrate is electrically connected to an interconnect only through shared contacts 9A1 and 9A2.

Embodiment 3

In the CMOS transistor of the first embodiment, openings for shared contacts 9A1 and 9A2 have a larger area than those for contacts CA1, CA2, and CA5 through CA10. In some cases, a large difference in area between the openings for the shared contacts 9A1 and 9A2 and the openings for the contacts CA1, CA2, and CA5 through CA10 causes a large difference between the finished shared contacts 9A1 and 9A2 and the finished contacts CA1, CA2, and CA5 through CA10, because these contacts are formed in the same process step. In view of the above, in the CMOS transistor of this embodiment, the area of each opening for the shared contacts 9A1 and 9A2 is brought closer to that of each opening for the contacts CA1, CA2, CA5 through CA10.

Figure 7:
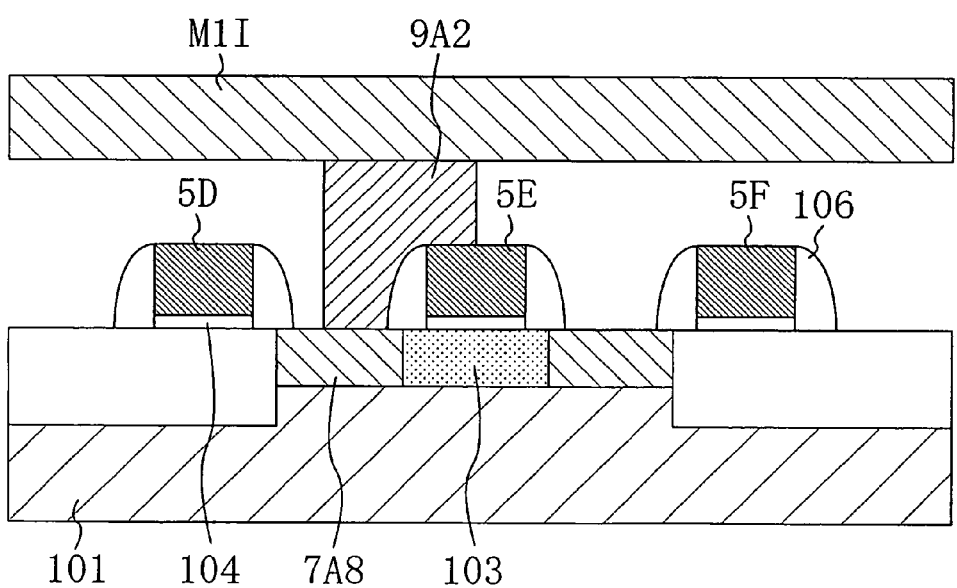
FIG. 7 is a cross-sectional view partly showing a CMOS transistor according to a third embodiment of the present invention.
Figure 8:
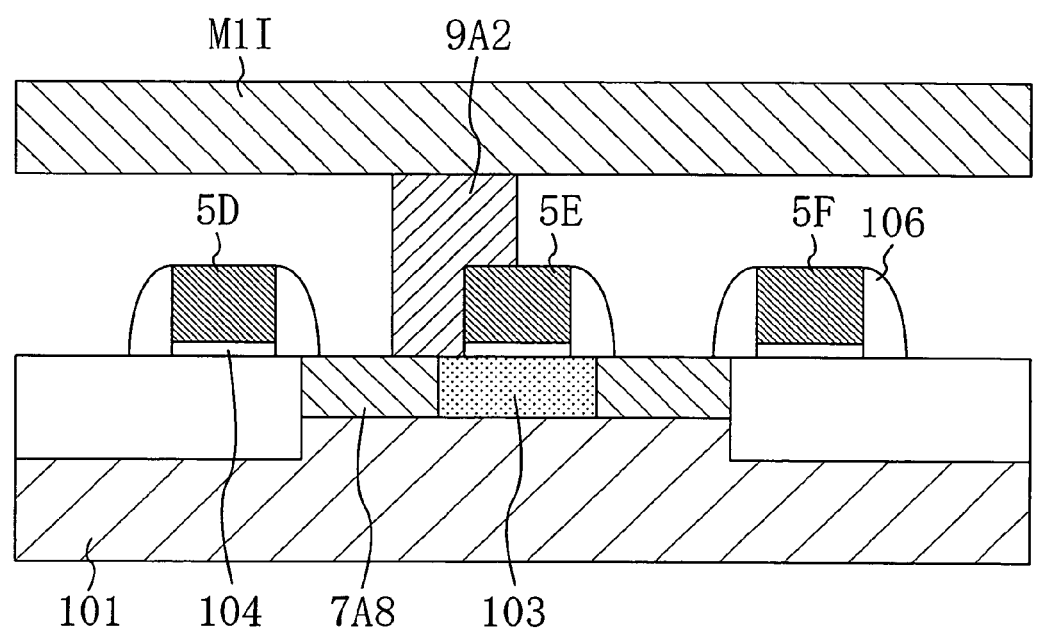
FIG. 8 is a cross-sectional view partly showing a modification of the CMOS transistor according to the third embodiment.
Figure 10:
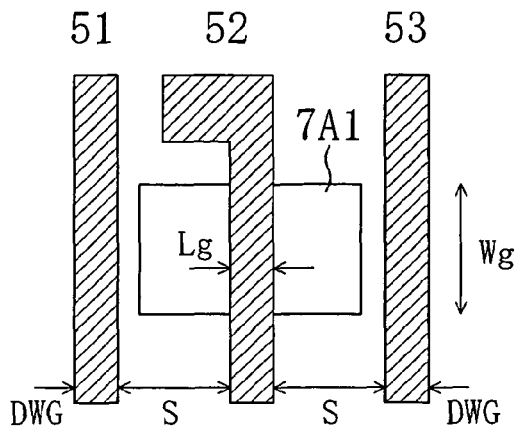
FIG. 10 is a plan view showing a part of a typical semiconductor integrated circuit.
Figure 11A:
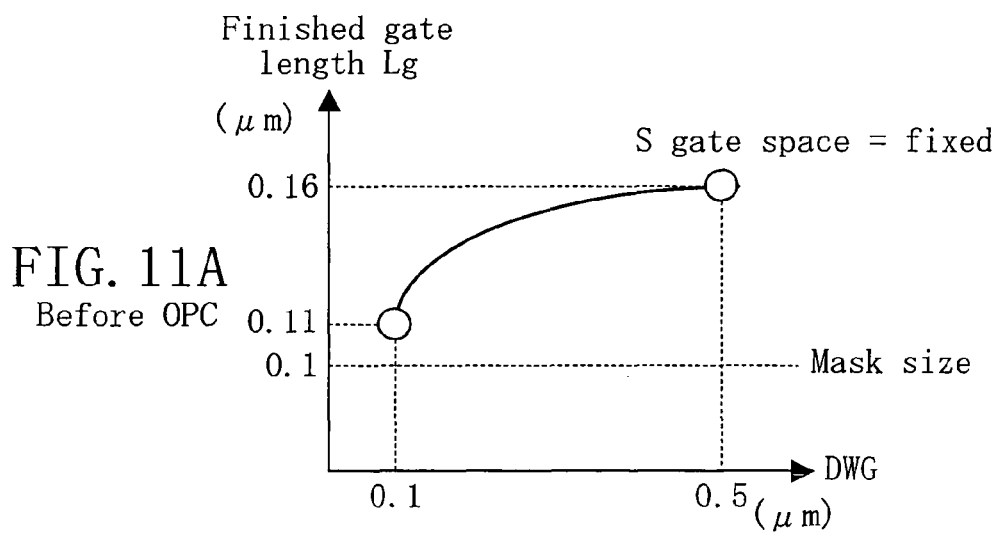
FIGS. 11A and 11B are graphs for explaining an example of an OPC technique.
Figure 11B:
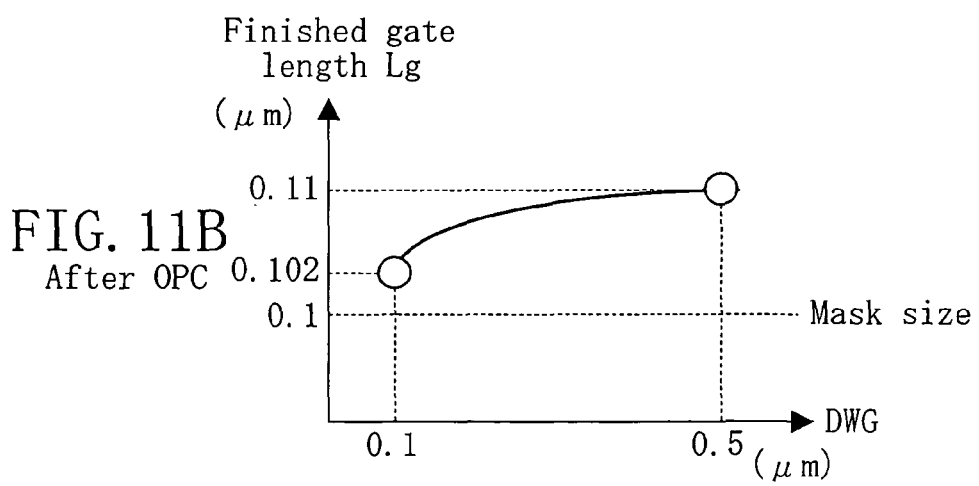
Figure 12:
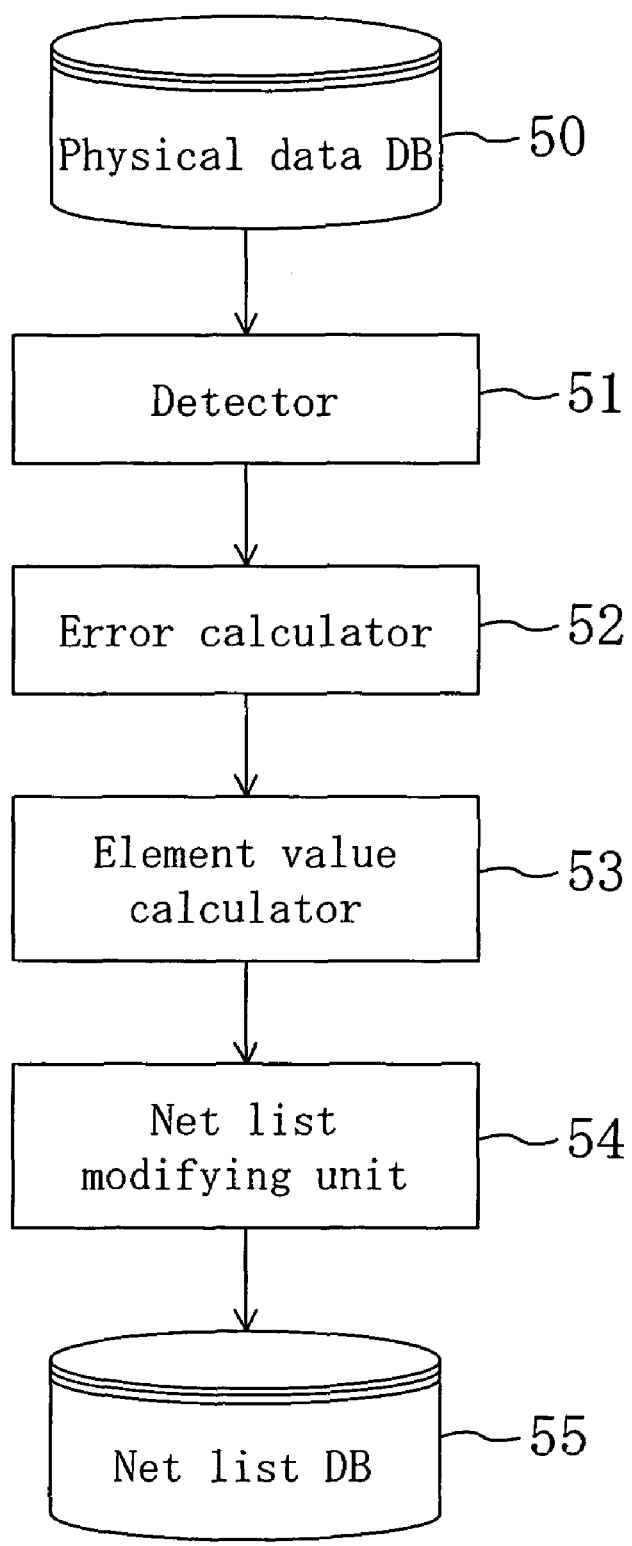
FIG. 12 is a flow chart showing a typical known fabricating method for a semiconductor integrated circuit using the OPC technique.
Figure 13:
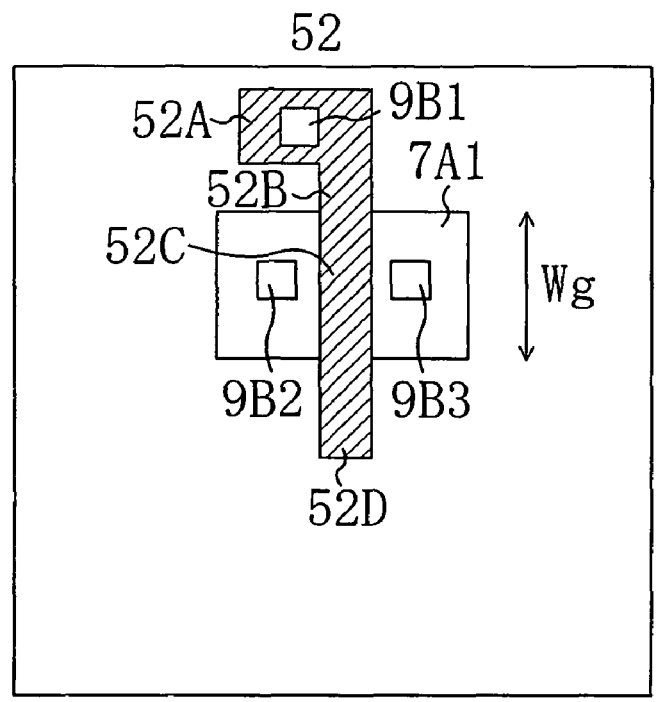
FIG. 13 is a plan view showing the design geometry of an N-channel type transistor typically used in a standard cell.
Figure 14:
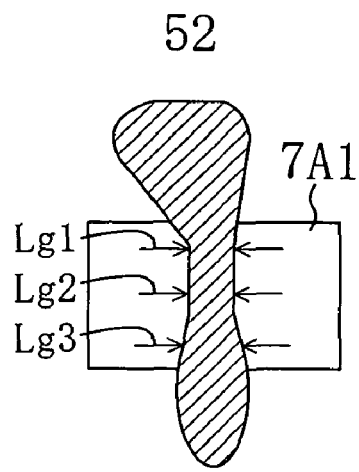
FIG. 14 is a plan view showing the geometry of a fabricated N-channel type transistor typically used in a standard cell.

FIG. 7 is a cross-sectional view showing the same part of a CMOS transistor according to a third embodiment of the present invention as in FIGS. 5 and 6. FIG. 8 is a cross-sectional view showing a variant of a CMOS transistor of this embodiment.

As shown in FIG. 7, the CMOS transistor shown in FIG. 6 is configured such that only a part of the gate electrode 5E and one of N-type impurity diffusion regions 7A8 are brought into contact with a shared contact 9A2. The area of an opening for a shared contact 9A2 of this embodiment becomes about half as large as that of an opening for a shared contact 9A2 of each CMOS transistor shown in FIGS. 5A, 5B and 6. On the other hand, the area of the opening for the shared contact 9A2 of this embodiment becomes approximately twice as large as that of an opening for each of contacts CA1, CA2, and CA5 through CA10. In view of the above, in the step of forming contacts, shared contacts 9A1 and 9A2 can be finished as set.

Furthermore, as shown in FIG. 8, a sidewall 106 is not formed on one side of a gate electrode 5E, and the one side of the gate electrode 5E may make contact with a shared contact 9A2. The elimination of a sidewall 106 reduces the mask size approximately by 50 through 60 nm, i.e., the thickness of the eliminated sidewall 106. This can further reduce the area of the opening for the shared contact 9A2, and the area of the opening for the shared contact 9A2 can be brought closer to the area of the opening for each of contacts CA1, CA2, and CA5 through CA10. Furthermore, since a shared contact can make contact with one side of the gate electrode 5E, the size of a part of a mask for a shared contact which overlaps with the gate electrode when viewed in plan need only be equal to the amount of the out-of-alignment between the mask for the formation of a gate electrode and a mask for the formation of a contact, i.e., about 30 through 40 nm. Since salicide films are formed on the gate electrode 5E and N-type impurity diffusion regions 7A8, a shared contact need only make contact with the gate electrode 5E or one of the N-type impurity diffusion regions 7A8 as shown in FIG. 9D. Therefore, the difference between the area of an opening for a shared contact and the area of an opening for each of the other contacts can be zero in theory.

FIGS. 9A through 9D are cross-sectional views showing some of process steps in a fabricating method for a semiconductor device (CMOS transistor) of this embodiment. The fabricating method for a CMOS transistor of this embodiment will be described hereinafter with reference to FIGS. 9A through 9D. In particular, different process steps from those shown in FIGS. 3A through 3C will be described.

First, as shown in FIG. 9A, an N well 101 is formed in a part of a substrate. Thereafter, a threshold control layer 103 is formed on the N well 101. Next, gate oxide films 104 and gate electrodes 5D, 5E and 5F are successively formed on parts of the threshold control layer 103, and then sidewalls 106 of SiN are formed on both sides of the gate electrodes 5D, 5E and 5F.

Next, as shown in FIG. 9B, a photo resist 120 for selectively removing the sidewalls 106 is obtained by patterning.

Subsequently, as shown in FIG. 9C, one of the sidewalls 106 is etched away under the condition that the etching rate of the SiN film (sidewall) is larger than those of the silicon oxide films and the gate electrodes. In this case, either of wet etching and dry etching can be used. After the photo resist 120 is removed, oxide films formed on the gate electrodes 5D, 5E and 5F are completely removed by wet etching. Thereafter, a metal film of cobalt (Co) or any other metal is deposited on a substrate and subjected to heat treatment, thereby forming CoSi salicide films 121 on the top surfaces of the gate electrodes 5D and 5F, the top surface and one side surface of the gate electrode 5E, and the N-type impurity diffusion regions 7A7, 7A8 and 7A9. Since in this case only gate oxide films are formed, as insulating films, between gate electrodes and impurity diffusion regions to have a very small thickness of 2 nm, one of the salicide films 121 formed on the gate electrode 5E becomes shorted with one of the salicide films 121 formed on the N-type impurity diffusion region 7A8.

In this embodiment, a description was given of a shared contact that makes contact with a part of a gate electrode and one of impurity diffusion regions. However, a photo resist for selectively removing sidewalls may cover the whole gate electrodes and impurity diffusion regions located to both sides of the gate electrodes, and a shared contact 9A2 may be formed on a gate electrode 5E. When no sidewall 106 is formed on both sides of the gate electrode 5E, a mask used to remove sidewalls 106 does not need to be fine. This facilitates the subsequent process.

Although in FIGS. 9A through 9D N-type impurity diffusion regions 7A7 and 7A9 are connected through contacts 109B to a first-level interconnect M1I, no contact 109B need be formed as shown in FIGS. 7 and 8.

Also when the structure of a MOS transistor in which a shared contact is formed without the formation of at least one sidewall on at least one side of a gate electrode is used for any semiconductor device other than the semiconductor device of this embodiment, openings for contact holes can have a uniform area. Therefore, with this structure, contact holes can be finished as designed when shared contacts are used also in an integrated circuit including any semiconductor device other than a CMOS transistor.

The semiconductor device of the present invention, which was exemplified above, is used as an LSI placed in various electronic devices.

What is claimed is:

1. A semiconductor device comprising:
   an isolation insulating film formed in a substrate;
   a first region in the substrate surrounded by the isolation insulating film;
   a second region in the substrate surrounded by the isolation insulating film and arranged with the isolation insulating film sandwiched between the first and second regions;
   a first gate electrode extending across the first region and the isolation insulating film onto the second region;
   a well of a first conductivity type having an upper portion including a lower portion of the first region, a lower portion of the second region, and a lower portion of the isolation insulating film formed between the first and second regions;
   first impurity diffusion regions of the second conductivity type located to both sides of the first gate electrode of the first region and formed in direct contact with the well of the first conductivity type;
   second impurity diffusion regions of the first conductivity type located to both sides of the first gate electrode of the second region and formed in direct contact with the well of the first conductivity type;
   a shared contact passing through an interlayer insulating film formed on the substrate and connected to the first gate electrode and the second impurity diffusion region; and
   an interconnect formed on the interlayer insulating film and connected to the shared contact.

2. The semiconductor device of claim 1, wherein
   the shared contact is connected to the second impurity diffusion regions formed on the both sides of the first gate electrode.

3. The semiconductor device of claim 1, wherein the shared contact is connected to only one of the second impurity diffusion regions located to the both sides of the first gate electrode of the second region.

4. The semiconductor device of claim 1, wherein
   sidewalls of an insulator is formed on the both sides of the first gate electrode.

5. The semiconductor device of claim 1, wherein
   the shared contact is connected to an upper surface and one side of the first gate electrode, and
   sidewalls of an insulator is formed on the other side of the first gate electrode.

6. The semiconductor device of claim 1, wherein
   the first conductivity type is a P-type,
   the second conductivity type is an N-type, and
   the interconnect is connected to the ground and the first gate electrode and the well are fixed at a ground potential.

7. The semiconductor device of claim 1, wherein
   the first conductivity type is an N-type,
   the second conductivity type is a P-type, and
   the interconnect are connected to a power voltage supply line and the first gate electrode and the well are fixed at a power potential.

8. The semiconductor device of claim 1, further comprising:
   a second gate electrode extending across the first region and the isolation insulating film onto the second region, wherein
   the first impurity diffusion regions are formed directly on the well and located to both sides of the second gate electrode of the first region,
   the second impurity diffusion regions are formed directly on the well and located to both sides of the second gate electrode of the second region, and
   the first and second gate electrode have the same geometry.

9. The semiconductor device of claim 1, further comprising:
   a second gate electrode extending across the first region onto the isolation insulating film in the direction where the second region is formed, wherein
   the first impurity diffusion regions are formed directly on the well and located to both sides of the second gate electrode of the first region, the first and second gate electrode have the same geometry, and the second region is not formed directly under the second gate electrode.

10. The semiconductor device of claim 9, wherein the isolation insulating film is arranged directly under the second gate electrode, the second region is provided in plurality and the second regions are arranged on both sides of the second gate electrode and sandwich the isolation insulating film.

11. The semiconductor device of claim 9, wherein the second region is arranged on one side of the second gate electrode, and the second region is not arranged on the other side of the second gate electrode and the isolation insulating film is arranged on the other side of the second gate electrode.

12. The semiconductor device of claim 1, wherein one of end portions of the first gate electrode which is closer to the second region does not extend beyond the second region in plan view.

* * * * *